United States Patent
Park et al.

(10) Patent No.: US 7,102,198 B2
(45) Date of Patent: Sep. 5, 2006

(54) ORGANIC ELECTROLUMINESCENT DISPLAY DEVICE

(75) Inventors: Jae-Yong Park, Gyeonggi-do (KR); Choong-Keun Yoo, Incheon (KR); Ock-Hee Kim, Gyeonggi-do (KR); Nam-Yang Lee, Gyeonggi-do (KR); Kwan-Soo Kim, Gyeonggi-do (KR)

(73) Assignee: LG.Philips LCD Co., Ltd., Seoul (KR)

( * ) Notice: Subject to any disclaimer, the term of this patent is extended or adjusted under 35 U.S.C. 154(b) by 0 days.

(21) Appl. No.: 11/118,413

(22) Filed: May 2, 2005

(65) Prior Publication Data

US 2005/0189872 A1 Sep. 1, 2005

Related U.S. Application Data

(63) Continuation of application No. 10/329,923, filed on Dec. 27, 2002, now Pat. No. 6,933,574.

(30) Foreign Application Priority Data

May 3, 2002 (KR) ................................ 2002-24552

(51) Int. Cl.
    *H01L 23/62* (2006.01)
(52) U.S. Cl. ................ 257/359; 257/40; 257/59; 257/72; 257/258; 313/500; 313/505
(58) Field of Classification Search ................ 313/500, 313/505; 257/40, 59, 72, 258, 359
See application file for complete search history.

(56) References Cited

U.S. PATENT DOCUMENTS

| 6,175,345 B1 | 1/2001 | Kuribayashi et al. |
| 6,559,594 B1 * | 5/2003 | Fukunaga et al. .......... 313/506 |
| 2002/0011783 A1 * | 1/2002 | Hosokawa .................. 313/504 |

* cited by examiner

*Primary Examiner*—Nathan J. Flynn
*Assistant Examiner*—Tan Tran
(74) *Attorney, Agent, or Firm*—Morgan, Lewis & Bockius, LLP

(57) ABSTRACT

An organic electroluminescent display device includes a first substrate, a second substrate spaced apart and facing the first substrate, a switching thin film transistor disposed on an inner surface of the first substrate, a driving thin film transistor electrically connected to the switching thin film transistor, a connecting electrode electrically connected to the driving thin film transistor, a first electrode disposed on an inner surface of the second substrate, a partition wall disposed on the first electrode and having a transmissive hole corresponding to a pixel region between the first and second substrates, an organic layer disposed within the transmissive hole on the first electrode, and a second electrode disposed on the organic layer, wherein the second electrode is electrically connected to the driving thin film transistor through the connecting electrode.

11 Claims, 11 Drawing Sheets

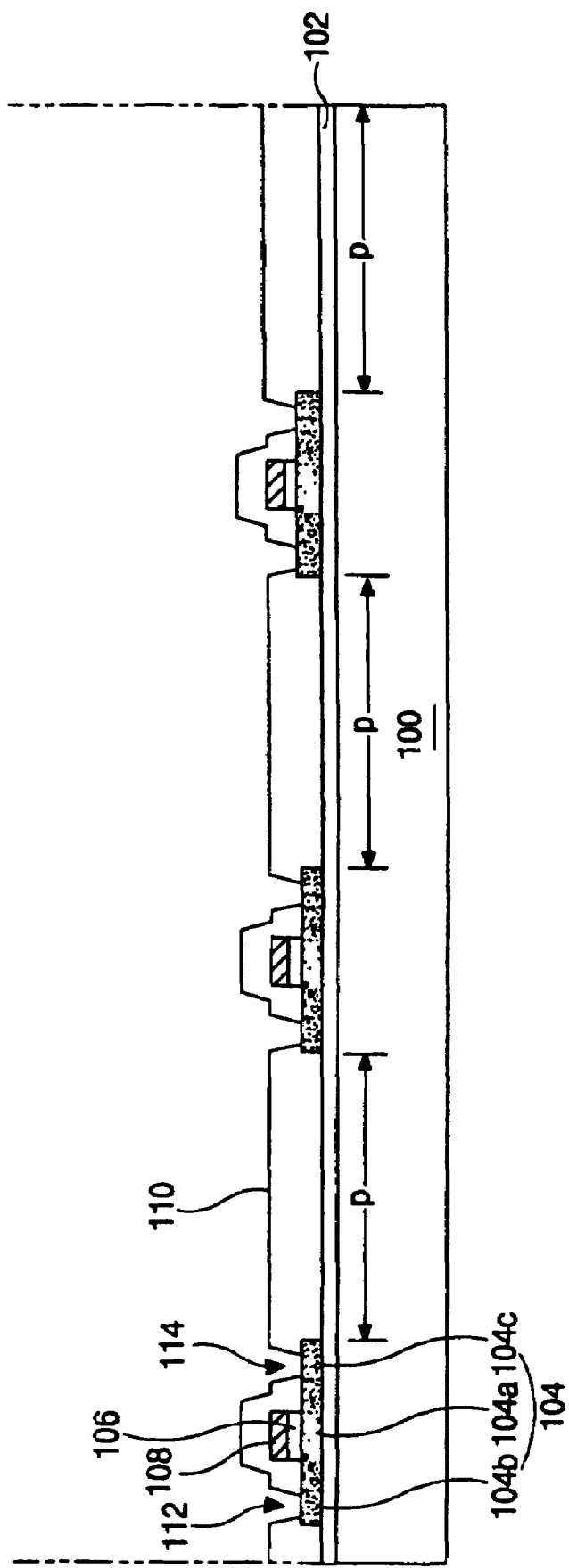

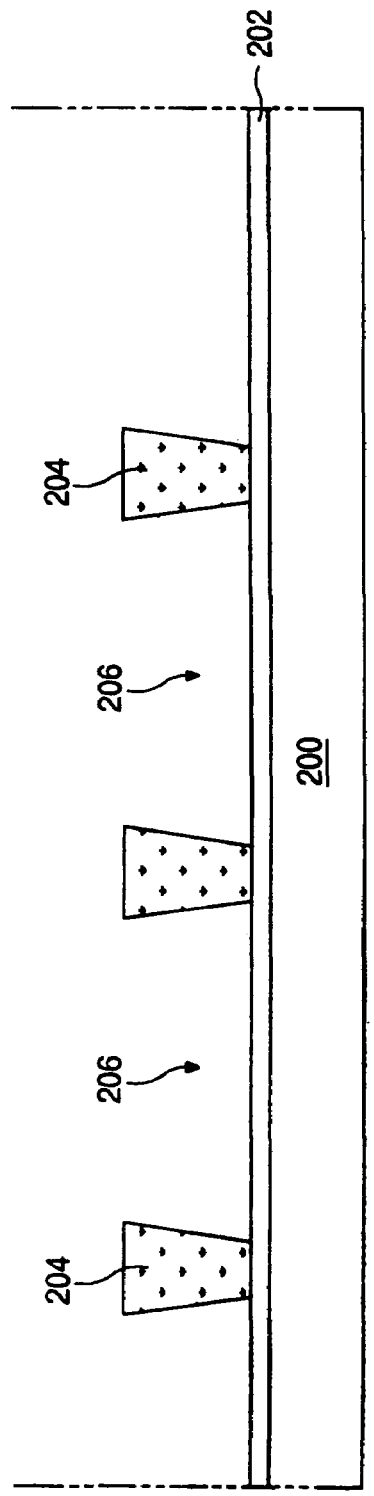
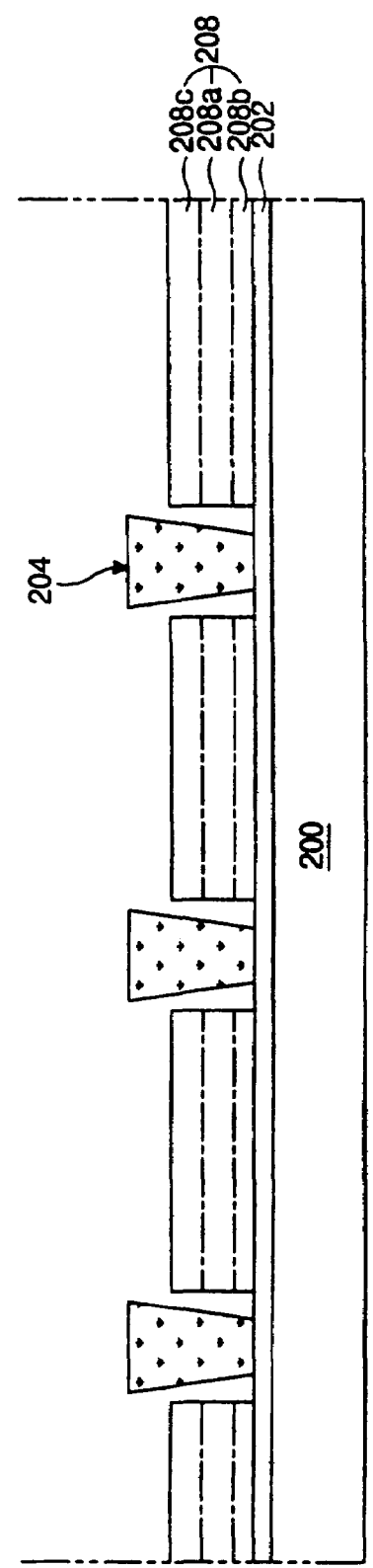

ORGANIC ELECTROLUMINESCENT DISPLAY DEVICE

This application is a Continuation of U.S. patent application Ser. No. 10/329,923 now U.S. Pat. No. 6,933,574 and claims the benefit of the Korean Patent Application No. P2002-024552 filed in Korea on May 3, 2002, which are hereby incorporated by reference in their entirety.

BACKGROUND OF THE INVENTION

1. Field of the Invention

The present invention relates to an electroluminescent display device, and more particularly, to an organic electroluminescent display device and a method of fabricating the same.

2. Discussion of the Related Art

In general, an organic electroluminescent display device emits light by injecting electrons from a cathode electrode and holes from an anode electrode into an emissive layer, combining the electrons and the holes to generate an exciton, and transiting the exciton from an excited state to a ground state. Since the organic electroluminescent display device does not require an additional light source due to its self-luminescence, the organic electroluminescent display device has a small size and is light weight, as compared to a liquid crystal display device. The organic electroluminescent display device also has low power consumption, high brightness, and short response time. Thus, the organic electroluminescent display device is used in most consumer electronic applications, such as cellular phones, car navigation systems (CNSs), personal digital assistants (PDAs), camcorders, and palm PCs. In addition, the organic electroluminescent display device can have reduced manufacturing costs because of its simple manufacturing processes.

Organic electroluminescent display devices may be categorized into passive matrix-type and active matrix-type depending upon the method used to drive the device. Passive matrix-type organic electroluminescent display devices have a simple structure and are fabricated through a simple manufacturing process. However, the passive matrix-type organic electroluminescent display devices have high power consumption, thereby preventing use in large area displays. Furthermore, in passive matrix organic electroluminescent display devices, aperture ratio decreases according to the increasing number of electrical lines. Thus, the passive matrix-type organic electroluminescent display devices are commonly used as small-sized display devices. Active matrix-type organic electroluminescent display (AMOELD) devices are commonly used as large-sized display devices since they have high luminous efficacy, and provide high definition images.

FIG. 1 is a cross sectional view of an active matrix-type organic electro-luminescent display (AMOELD) device according to the related art. In FIG. 1, the AMOELD device 10 includes a first substrate 12 and a second substrate 28, which are spaced apart and face each other. A plurality of thin film transistors T and a plurality of first electrodes 16 are formed on an inner surface of the first substrate 12, wherein each of first electrodes 16 are connected to each of thin film transistors T. Organic layers 18 are formed on the first electrodes 16 and the thin film transistors T, and a second electrode 20 is formed on the organic layers 18. The organic layers 18 emit light of three colors: red (R), green (G), and blue (B) within a pixel region P, and are generally formed by patterning an organic material.

A desiccant 22 is formed on an inner surface of the second substrate 28 to remove any external moisture and air that may permeate into a space between the first and second substrates 12 and 28. The inner surface of the second substrate 28 is patterned to form a groove, and the desiccant 22 is disposed within the groove and is fastened with a tape 25.

A sealant 26 is formed between the first and second substrates 12 and 28, and surrounds elements, such as the thin film transistors T, the first electrodes 16, the organic layers 18, and the second electrodes 20. The sealant 26 forms an airtight space to protect the elements from the external moisture and air.

FIG. 2 is a plan view for a pixel of an AMOELD device according to the related art. In FIG. 2, the pixel includes a switching thin film transistor (TFT) $T_S$, a driving thin film transistor (TFT) $T_D$, and a storage capacitor $C_{ST}$. In addition, a gate line 32 and a data line 34 are formed on a substrate 12, and are formed of a transparent material, such as glass and plastic. The gate line 32 and the data line 34 cross each other to define a pixel region P, and a power line 35 is formed parallel to the data line 34.

The switching TFT $T_S$ and the driving TFT $T_D$ include a gate electrodes 36 and 38, an active layer 40 and 42, a source electrode 46 and 48, and a drain electrode 50 and 52, respectively. The gate electrode 36 of the switching TFT $T_S$ is connected to the gate line 32, and the source electrode 46 of the switching TFT $T_S$ is connected to the data line 34. The drain electrode 50 of the switching TFT $T_S$ is connected to the gate electrode 38 of the driving TFT $T_D$ through a first contact hole 54, and the source electrode 48 of the driving TFT $T_D$ is connected to the power line 35 through a second contact hole 56. The drain electrode 52 of the driving TFT $T_D$ is connected to a first electrode 16 in the pixel region P. A capacitor electrode 15 overlaps the power line 35 to form the storage capacitor $C_{ST}$, and is made of doped polycrystalline silicon and is connected to the drain electrode 50 of the switching TFT $T_S$.

FIG. 3 is a cross sectional view of the AMOELD device along III—III of FIG. 2 according to the related art. In FIG. 3, the driving TFT $T_D$ is formed on the substrate 12, and includes the gate electrode 38, the active layer 42, and the source and drain electrodes 48 and 52. An insulating layer 57 covers the driving TFT $T_D$, and the first electrode 16 is formed on the insulating layer 57 to electrically contact the drain electrode 52. An organic layer 18 that emits one color of light is formed on the first electrode 16, and the second electrode 20 is formed on the organic layer 18 over an entire surface of the substrate 12.

FIG. 4 is a cross sectional view of the AMOELD device along IV—IV of FIG. 2 according to the related art. In FIG. 4, the switching TFT $T_S$ is formed over the substrate 12, and includes the gate electrode 36, the active layer 40, and the source and drain electrodes 46 and 50. On the other hand, the storage capacitor $C_{ST}$ is formed over the substrate 12 and includes the capacitor electrode 15 and the power line 35. The insulating layer 57 covers the switching TFT $T_S$ and the storage capacitor $C_{ST}$, and the first electrode (not shown) is formed on the insulating layer 57. Next, the organic layer is formed on the first electrode, and is positioned between adjacent partition walls 70. The organic layer 18 is generally includes an emissive layer, a hole transporting layer, and an electron transporting layer. The emissive layer is disposed between the hole transporting layer and the electron transporting layer. The partition wall 70 corresponds to the data line 34 and the power line 35 to prevent the organic layer from contacting the adjacent pixel region P. The second electrode 20 is formed on the organic emissive layer and on sidewalls of the partition wall 70. An upper part of the partition wall 70 has a width narrower than a lower part of the partition wall 70 to form the second electrode 20 not only on the emissive layers but also on the partition wall 70.

In addition, a yield of the AMOELD device depends on yields of the thin film transistor and the organic layer. The yield of the AMOELD device varies due to impurities in the process of forming the organic layer to a thickness of about 1,000 Å. Accordingly, the yield of the AMOELD is reduced because of the impurities, thereby resulting in a loss of manufacturing costs and source materials for the thin film transistor.

Moreover, the AMOELD device is a bottom emission mode device having stability and degrees of freedom for the manufacturing processes. However, the bottom emission mode device has a reduced aperture ratio. Thus, the bottom emission mode AMOELD has difficulty in being used as a high aperture device. On the other hand, a top emission mode AMOELD has a high aperture ratio, and is easy to manufacture. However, in the top emission mode AMOELD, since a cathode electrode is generally disposed over the organic layer, a choice of material with which to make the cathode electrode is limited. Accordingly, transmittance of light is limited, and a luminous efficacy is reduced. Furthermore, in order to improve light transmittance the passivation layer should be formed as a thin film, whereby the exterior moisture and air is not fully blocked.

SUMMARY OF THE INVENTION

Accordingly, the present invention is directed to an organic electroluminescent display device and a method of fabricating the same that substantially obviates one or more of the problems due to limitations and disadvantages of the related art.

An object of the present invention is to provide an organic electro-luminescent display device and a method of fabricating the same having a high aperture ratio.

Another object of the present invention is to provide an organic electro-luminescent display device and a method of fabricating the same having an improved yield and productivity.

Another object of the present invention is to provide an organic electro-luminescent display device and a method of fabricating the same that are reliable.

Additional features and advantages of the invention will be set forth in the description which follows and in part will be apparent from the description, or may be learned by practice of the invention. The objectives and other advantages of the invention will be realized and attained by the structure particularly pointed out in the written description and claims hereof as well as the appended drawings.

To achieve these and other advantages and in accordance with the purpose of the present invention, as embodied and broadly described, an organic electroluminescent display device includes a first substrate, a second substrate spaced apart and facing the first substrate, a switching thin film transistor disposed on an inner surface of the first substrate, a driving thin film transistor electrically connected to the switching thin film transistor, a connecting electrode electrically connected to the driving thin film transistor, a first electrode disposed on an inner surface of the second substrate, a partition wall disposed on the first electrode and having a transmissive hole corresponding to a pixel region between the first and second substrates, an organic layer disposed within the transmissive hole on the first electrode, and a second electrode disposed on the organic layer, wherein the second electrode is electrically connected to the driving thin film transistor through the connecting electrode.

In another aspect, a method of fabricating an organic electroluminescent display device includes forming a switching thin film transistor and a driving thin film transistor electrically interconnected on a first substrate, forming a connecting electrode electrically contacting the driving thin film transistor, forming a first electrode on a second substrate, forming a partition wall on the first electrode to have a transmissive hole corresponding to a pixel region between the first and second substrates, forming an organic layer on the first electrode within the transmissive hole, forming a second electrode on the organic layer, and bonding the first and second substrates together, wherein the connecting electrode electrically contacts the second electrode.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this application, illustrate embodiments of the invention and together with the description serve to explain the principle of the invention. In the drawings:

FIGS. 6A to 6C are cross sectional views of an exemplary manufacturing process of a first substrate including a thin film transistor of an AMOELD device according to the present invention;

FIGS. 7A to 7C are cross sectional views of an exemplary manufacturing process of a second substrate including a luminescent diode according to the present invention;

DETAILED DESCRIPTION OF THE ILLUSTRATED EMBODIMENTS

Reference will now be made in detail to the illustrated embodiment of the present invention, an example of which is illustrated in the accompanying drawings.

Figure 1:
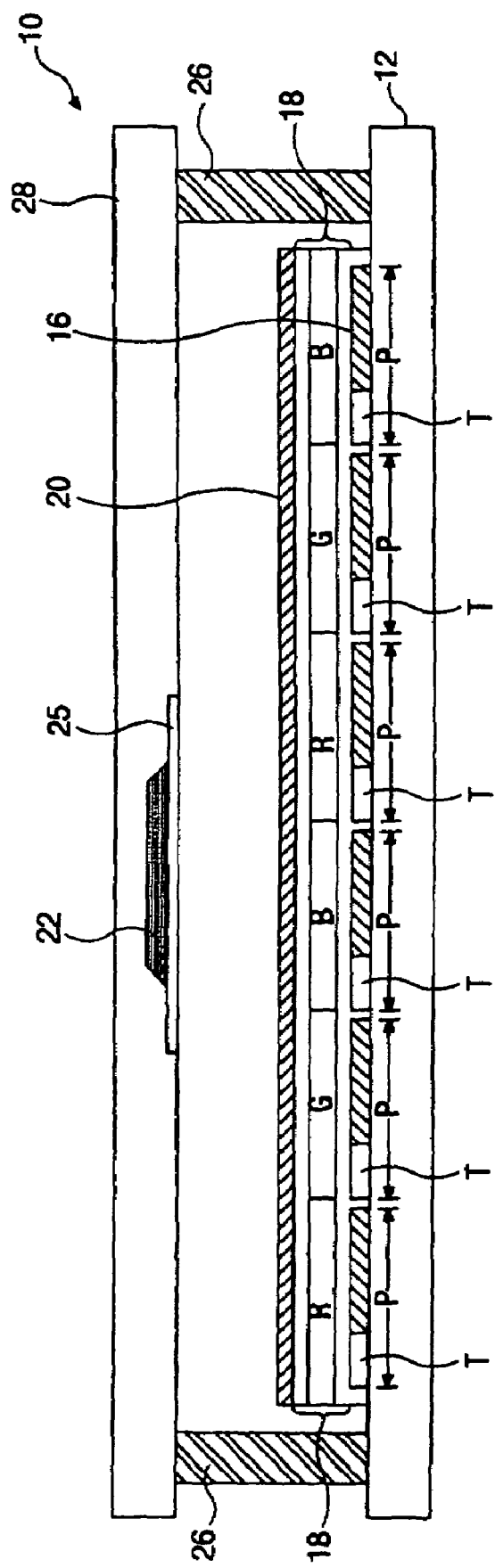
FIG. 1 is a cross sectional view of an active matrix-type organic electro-luminescent display (AMOELD) device according to the related art.
Figure 2:
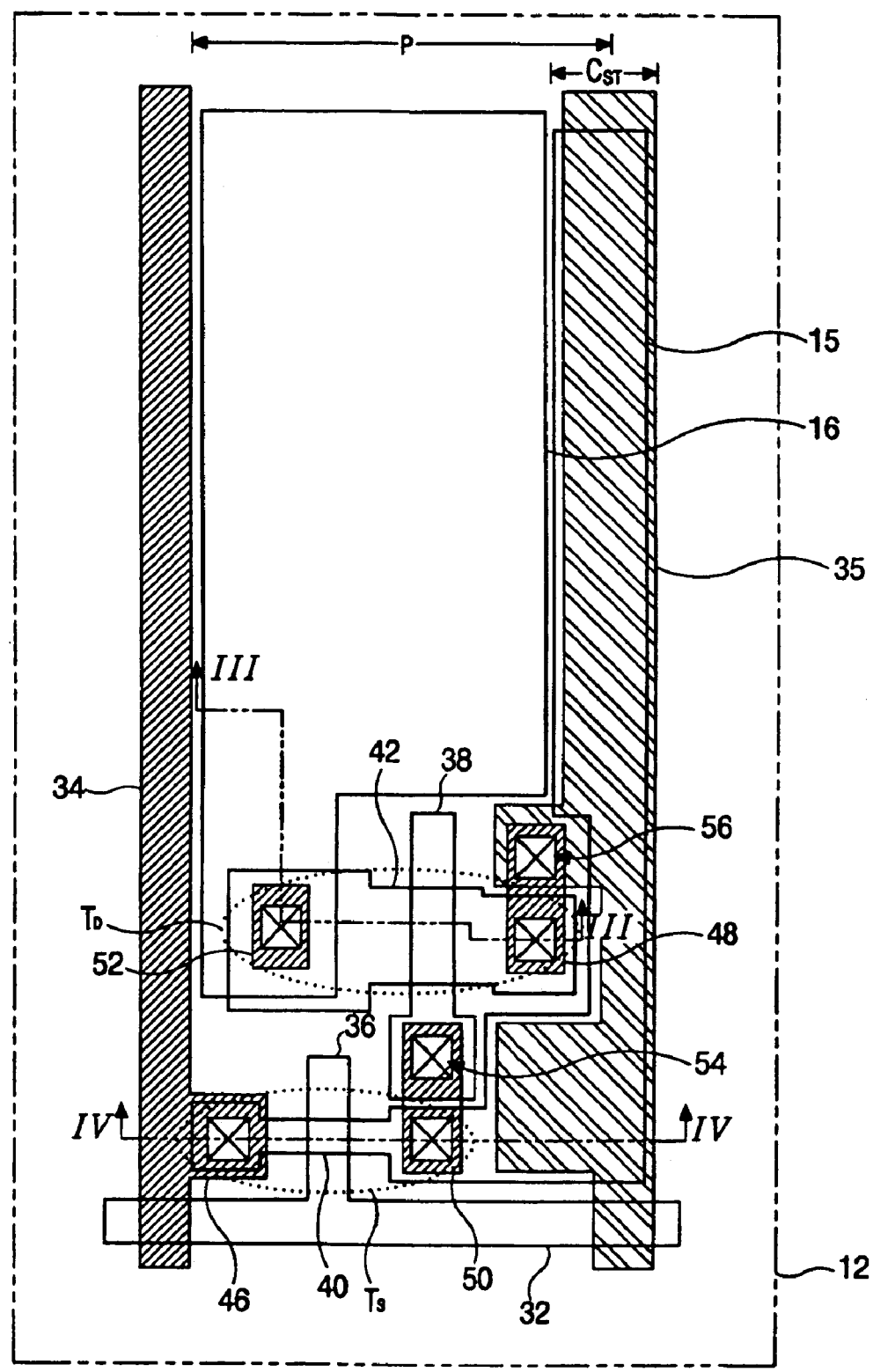
FIG. 2 is a plan view for a pixel of an AMOELD device according to the related art.
Figure 3:
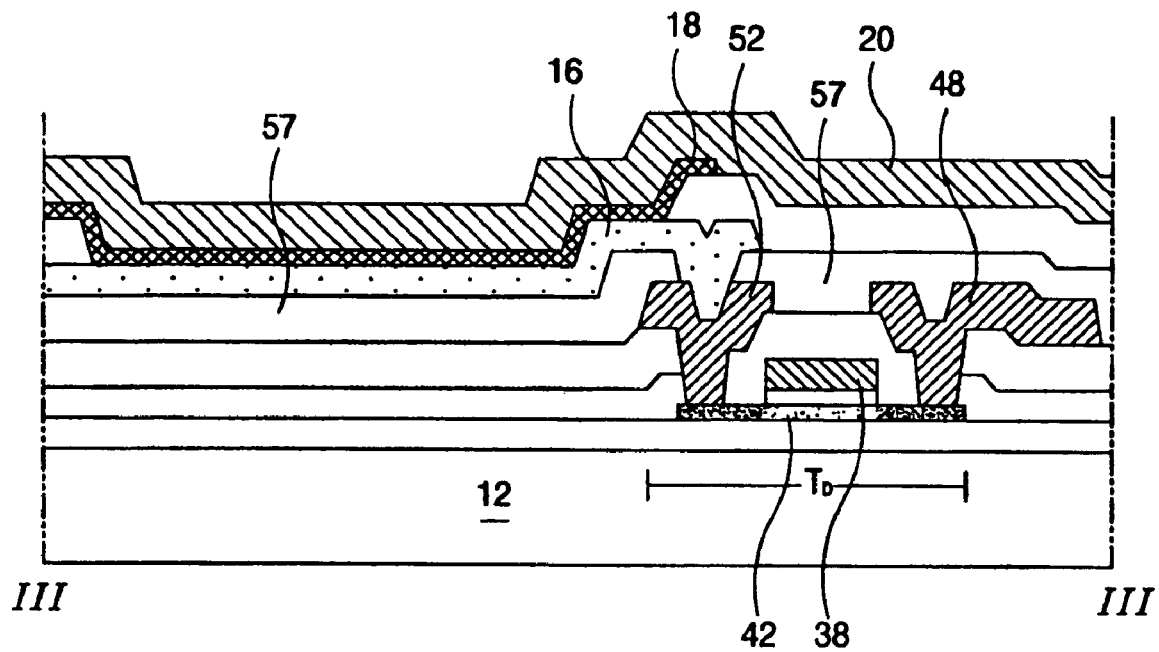
FIG. 3 is a cross sectional view of the AMOELD device along III—III of FIG. 2 according to the related art.
Figure 4:
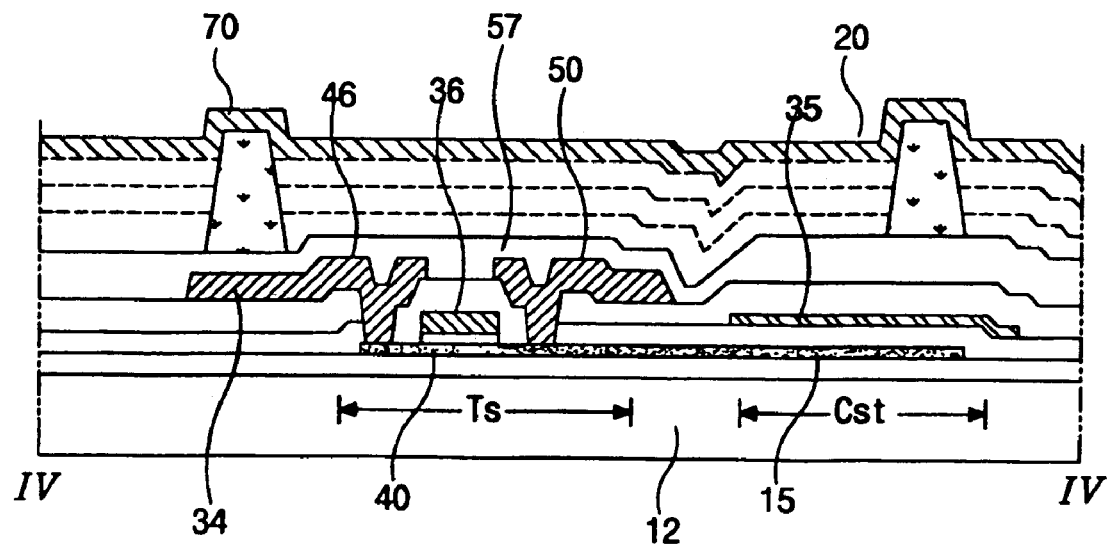
FIG. 4 is a cross sectional view of the AMOELD device along IV—IV of FIG. 2 according to the related art.
Figure 5:
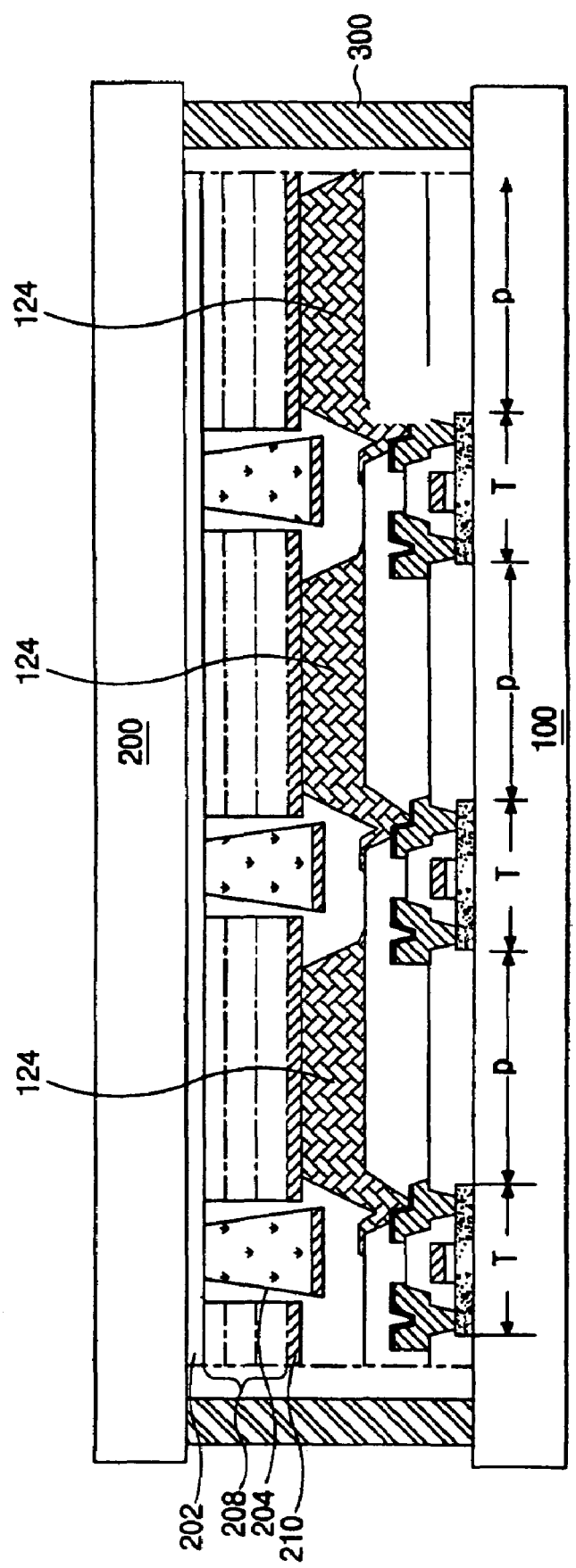
FIG. 5 is a cross sectional view of an exemplary AMOELD device according to the present invention.

FIG. 5 is a cross sectional view of an exemplary AMOELD device according to the present invention. In FIG. 5, the AMOELD device may include a first substrate 100 and a second substrate 200 that are spaced apart and face each other. A sealant 300 may be formed between the first and second substrates 100 and 200 to bond the first and second substrates 100 and 200 together.

A plurality of thin film transistors T may be formed on an inner surface of the first substrate 100, wherein the thin film transistor T may functions as a driving thin film transistor of the AMOELD device. Although not shown, a switching thin film transistor, a gate line, a data line, and a power line may also formed on the inner surface of the first substrate 100.

A first electrode 202 may be formed on an inner surface of the second substrate 200. The first electrode 202 may include transparent conductive material or materials, and may function as an anode electrode for injecting holes into an organic layer to be formed thereon. A partition wall 204 may be formed on the first electrode 202 to include a plurality of holes to define a pixel region "P." The partition wall 204 may have a lattice shape as seen in a plan view. A plurality of organic layers 208 may be formed within the pixel region "P" on the first electrode 202, and a plurality of second electrodes 210 may be formed on the organic emissive layers 208.

A plurality of connecting electrodes 124 may be formed between the second electrodes 210 and the thin film transistors T, and may electrically interconnect the second electrode 210 to the thin film transistor T. The connecting electrodes 124 may be formed on the first substrate 100 including the thin film transistors T, and may be made of the same material as the second electrode 210.

Figure 6B:
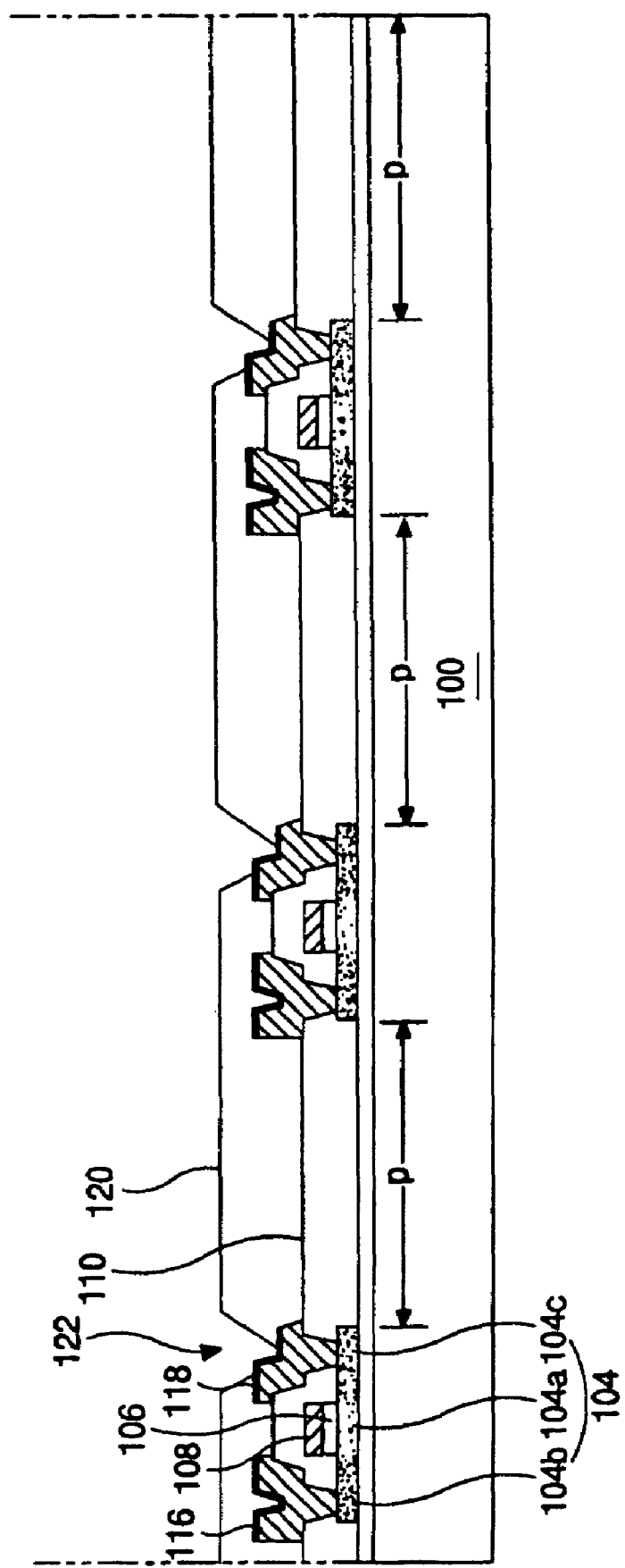
Figure 6C:
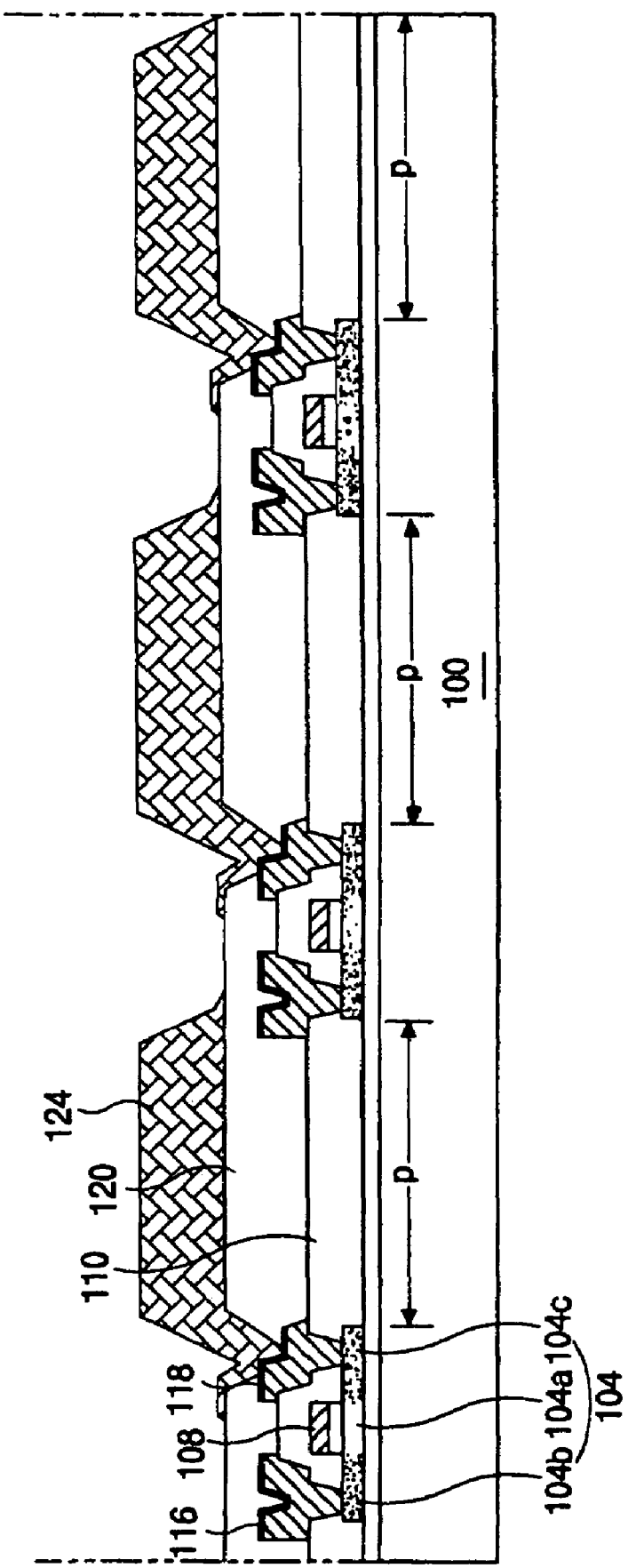

FIGS. 6A to 6C are cross sectional views of an exemplary manufacturing process of a first substrate including a thin film transistor of an AMOELD device according to the present invention. In FIG. 6A, a buffer layer 102 may be formed on an entire surface of a first substrate 100. The buffer layer 102 may include an insulating material that includes silicon, such as silicon nitride and silicon oxide. A polysilicon layer 104 may be formed on the buffer layer 102 by depositing an amorphous silicon layer, dehydrogenating the amorphous silicon layer, crystallizing the amorphous silicon layer by heat, and patterning. The polysilicon layer 104 may include an active layer 104a, and source and drain regions 104b and 104c, wherein the active layer 104a may be disposed between the source and drain regions 104b and 104c. Next, a gate insulating layer 106 and a gate electrode 108 may be subsequently formed on the active layer 104a, and may be formed on the entire first substrate 100 including the polysilicon layer 104. The gate insulating layer 106 may include insulating materials, such as silicon nitride and silicon oxide. The gate electrode 108 may include one of aluminum, an aluminum alloy, copper, tungsten, tantalum, and molybdenum. Next, impurities having a valence of three or a valence of four may be doped into the source and drain regions 104b and 104c using the gate electrode 108 as a doping mask. The impurities may include boron (B) or phosphorous (P), for example. An inter layer 110 may be formed on the entire first substrate 100 having the gate electrode 108, and may be patterned to form first and second contact holes 112 and 114. The first and second contact holes 112 and 114 may be formed to expose portions of the source and drain regions 104b and 104c, respectively. The inter layer 110 may include insulating materials, such as silicon nitride and silicon oxide.

In FIG. 6B, source and drain electrodes 116 and 118 may be formed on the inter layer 110 by depositing a metal layer, and then patterning the metal layer. The source and drain electrodes 116 and 118 may be electrically connected to the source and drain regions 104b and 104c through the first and second contact holes 112 and 114, respectively. Subsequently, a passivation layer 120 may be formed on the entire first substrate 100, including the source and drain electrodes 116 and 118. The passivation layer 120 may be patterned to form a third contact hole 122 that exposes a portion of the drain electrode 118. The gate electrode 108, and source and drain electrodes 116 and 118 form a thin film transistor that functions as a driving thin film transistor (TFT) of the AMOELD device. On the other hand, a switching TFT may be formed to be electrically connected to the driving TFT using the fabrication process for the driving TFT.

In FIG. 6C, a connecting electrode 124 may be formed on the passivation layer 120 by depositing and patterning a conductive material. The connecting electrode 124 may be electrically connected to the drain electrode 118 through the third contact hole 122. Although not shown, a gate line may be formed during the steps of forming the gate electrode 108, and a data line may be formed during the step of forming the source and drain electrodes 116 and 118.

Figure 7C:
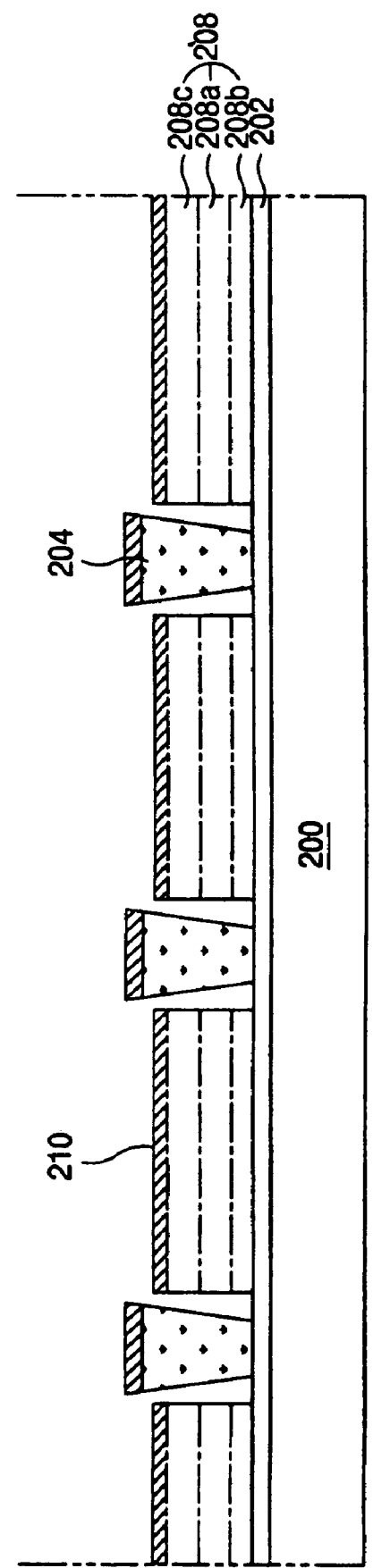
Figure 8:
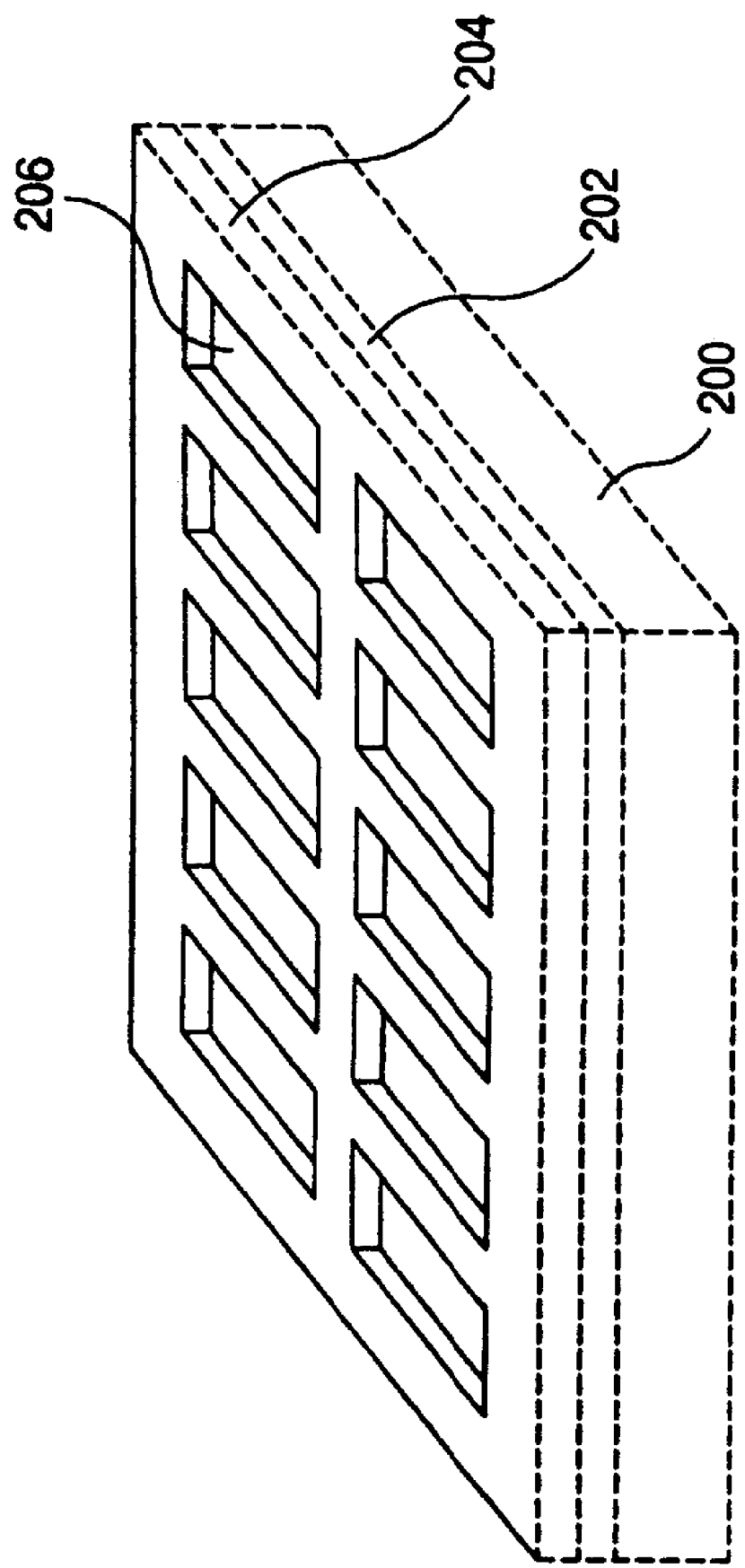
FIG. 8 is a perspective view of the second substrate of FIG. 7A according to the present invention.

FIGS. 7A to 7C are cross sectional views of an exemplary manufacturing process of a second substrate including a luminescent diode according to the present invention, and FIG. 8 is a perspective view of the second substrate of FIG. 7A according to the present invention. In FIG. 7A, a first transparent electrode 202 may be formed on a second substrate 200, wherein the first electrode 202 may function as an anode electrode for injecting holes into a subsequently formed emissive layer. The first electrode 202 may have a relatively high work function, and may include indium-tin-oxide. Next, a partition wall 204 may be formed on the first electrode 202 by depositing or coating an insulating material, and then patterning the insulating material.

Figure 9:
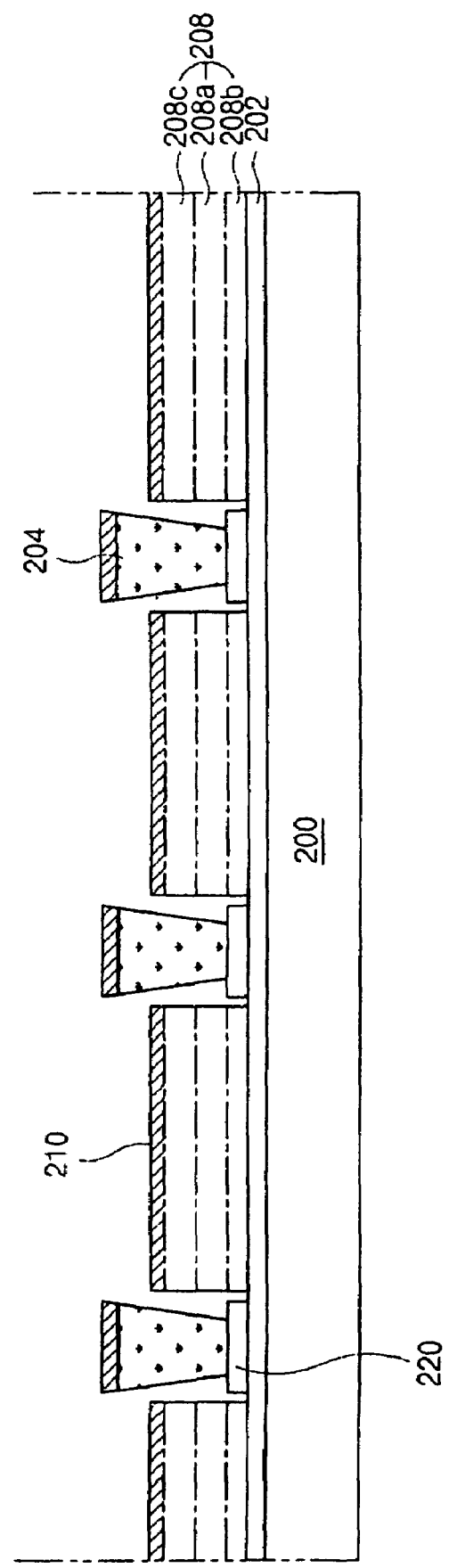
FIG. 9 is a cross sectional view of another exemplary second substrate according to the present invention.

In FIG. 8, the partition wall 204 may be formed to include a plurality of transmissive holes 206 that correspond to each pixel regions P. The partition wall 204 may include organic materials or inorganic materials, and may be formed to have an upper part wider than a lower part that contacts the first electrode 202. As shown in FIG. 9, an insulating layer having the same width as the upper part of the partition wall 204 may be formed between the first electrode 202 and the partition wall 204 to prevent the first electrode 202 from contacting a second electrode that will be subsequently formed on the partition wall 204.

In FIG. 7B, an organic layer 208 may be formed within each of the transmissive holes 206 on the first electrode 202. The organic layer 208 emits light of red (R), green (G), and blue (B), and may be formed of a single layer or of multiple layers. The organic layer 208 may include an emissive layer 208a, a hole transporting layer 208b, and an electron transporting layer 208c, wherein the hole transporting layer 208b may contact the first electrode 202 and the emissive layer 208a may be disposed between the hole transporting layer 208b and the electron transporting layer 208c. In addition, the partition wall 204 may have a height larger than a height of the organic layer 208.

In FIG. 7C, a second electrode 210 may be formed on the organic layer 208 and the partition wall 204. Since the partition wall 204 may have a shape of an inverse trapezoid, the second electrode 210 may not be formed on sidewalls of the partition wall 204. Accordingly, the second electrode 210 formed on the organic layer 208 may be physically disconnected from the second electrode 210 at the partition wall 204. Since the second electrode 210 may have a relatively low work function, the second electrode may function as a cathode electrode of the luminescent diode. The second electrode 210 may include one of aluminum, calcium, and magnesium, and may be formed in a double layer of lithium-fluorine and aluminum, for example.

Next, the first substrate 100 and the second substrate 200 may be bonded together, wherein the connecting electrode 124 (in FIG. 6C) electrically contacts the second electrode 210.

In the present invention, the thin film transistor is formed on the first substrate and the organic layer is formed on the second substrate. Furthermore, since the first electrode is disposed over the second electrode and is transparent, the AMOELD is a top emission mode. Therefore, the AMOELD and a method of fabricating the same have a high aperture ratio and provide an improved yield and productivity. Additionally, the AMOELD and a method of fabricating the same are reliable.

It will be apparent to those skilled in the art that various modifications and variations can be made in the organic electroluminescent display device and the method of fabricating the same of the present invention without departing from the spirit or scope of the inventions. Thus, it is intended that the present invention covers the modifications and variations of this invention provided they come within the scope of the appended claims and their equivalents.

What is claimed is:

1. An organic electroluminescent display device, comprising:
   a first substrate;
   a second substrate spaced apart and facing the first substrate;
   a switching thin film transistor disposed on an inner surface of the first substrate;
   a driving thin film transistor electrically connected to the switching thin film transistor;
   a connecting electrode electrically connected to the driving thin film transistor;
   a first electrode disposed on an inner surface of the second substrate;
   a partition wall disposed on the first electrode and having a transmissive hole corresponding to a pixel region between the first and second substrates;
   an organic layer disposed within the transmissive hole on the first electrode; and
   a second electrode disposed on the organic layer, wherein the second electrode is electrically connected to the driving thin film transistor through the connecting electrode and the second electrode is spaced apart from the driving thin film transistor with a vacant space therebetween.

2. The device according to claim 1, wherein a first end of the partition wall includes a first end having a first width contacting the first electrode and a second end having a second width contacting the second electrode.

3. The device according to claim 2, wherein the second width is larger than the first width.

4. The device according to claim 1, wherein the first electrode functions as an anode electrode for injecting holes into the organic layer and the second electrode functions as a cathode electrode for injecting electrons into the organic layer.

5. The device according to claim 4, wherein the first electrode includes indium-tin-oxide.

6. The device according to claim 4, wherein the second electrode includes one of calcium, aluminum, and magnesium.

7. The device according to claim 1, wherein the connecting electrode includes one of calcium, aluminum, and magnesium.

8. The device according to claim 1, wherein the organic layer includes a hole transporting layer contacting the first electrode, an electron transporting layer contacting the second electrode, and an emissive layer between the hole transporting layer and the electron transporting layer.

9. The device according to claim 1, further comprising an insulating pattern between the first electrode and the partition wall.

10. The device according to claim 9, wherein the insulating pattern includes a first width equal to a width of the partition wall that contacts the second electrode.

11. The device according to claim 1, wherein each of the switching and driving thin film transistors includes a gate electrode, an active layer, and source and drain electrodes.

* * * * *